United States Patent [19]

Lemnios et al.

[11] Patent Number: 5,162,258

[45] Date of Patent: Nov. 10, 1992

[54] THREE METAL PERSONALIZATION OF APPLICATION SPECIFIC MONOLITHIC MICROWAVE INTEGRATED CIRCUIT

[76] Inventors: Zachary J. Lemnios, 710 Wuthering Heights Dr., Colorado Springs, Colo. 80921; David G. McIntyre, 5424 Del Rey, Colorado Springs, Colo. 80918; Chung-Lim Lau, 270 Rimview Dr., #1, Colorado Springs, Colo. 80919; Dennis A. Williams, 2877 Deliverance, Colorado Springs, Colo. 80918

[21] Appl. No.: 496,399

[22] Filed: Mar. 20, 1990

Related U.S. Application Data

[62] Division of Ser. No. 258,607, Oct. 17, 1988, Pat. No. 4,959,705.

[51] Int. Cl.$^5$ .............................................. H01L 21/44
[52] U.S. Cl. ....................................... 437/184; 437/47; 437/60; 437/51; 437/195; 437/919; 257/296; 257/528
[58] Field of Search ................... 437/47, 60, 184, 51, 437/54, 50, 919, 195; 357/51

[56] References Cited

U.S. PATENT DOCUMENTS

| 4,419,812 | 12/1983 | Topich | 437/47 |
| 4,670,297 | 6/1987 | Lee et al. | 437/184 |
| 4,673,958 | 6/1987 | Bayraktaroglu | 357/51 |
| 4,785,202 | 11/1988 | Toyoda | 357/51 |
| 4,789,645 | 12/1988 | Calviello et al. | 437/60 |

FOREIGN PATENT DOCUMENTS

| 0046551 | 5/1987 | Japan | 437/47 |
| 0073758 | 10/1987 | Japan | 437/47 |

Primary Examiner—Brian E. Hearn
Assistant Examiner—Trung Dang

[57] ABSTRACT

A (GaAs-resident) application specific monolithic microwave integrated circuit (ASMMIC) is fabricated through the use of footprints that include a portion of the metallization through which the circuit components within the wafer are to be interconnected. The metallization is a three layers structure, the first two layers of which include strategically arranged reactance circuit components (MIM) capacitors. A first of the three metal layers is formed on a first surface of the substrate which contains a plurality of semiconductor device regions and conductive material for ohmic contact to the regions, so that portions of the first metal layer are in ohmic contact with the conductive material. The first metal layer provides the bottom plate of the MIM capacitors. A dielectric layer, which serves as the dielectric insulator of the MIM capacitors, is formed on second portions of the first metal layer. A second, intermediate metal layer is selectively formed on the second portions of the first metal layer, to provide top plate segments of MIM capacitors. Personalization of the footprint is effected by an air bridge metal layer interconnecting the first and second metal layers and thereby semiconductor device regions of the semiconductor structure with capacitive reactance elements formed by the first and second metal layers.

18 Claims, 7 Drawing Sheets

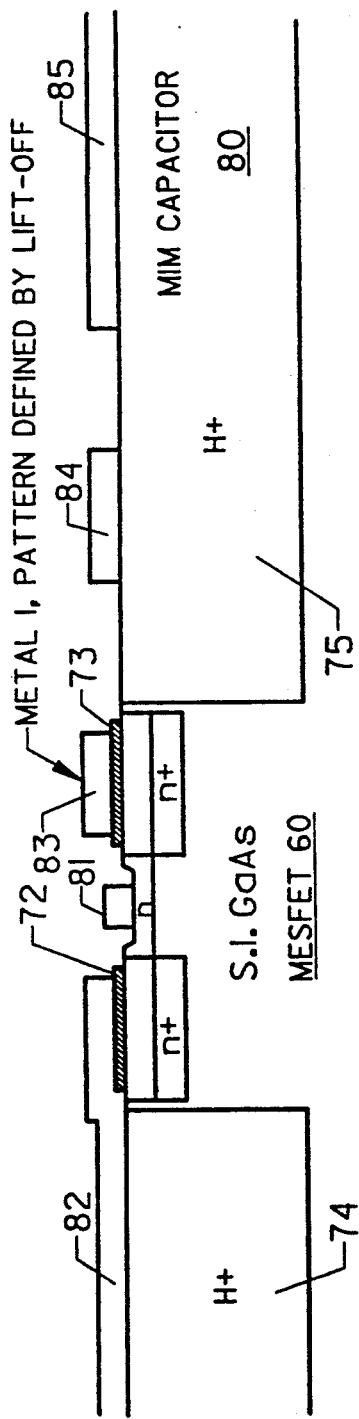
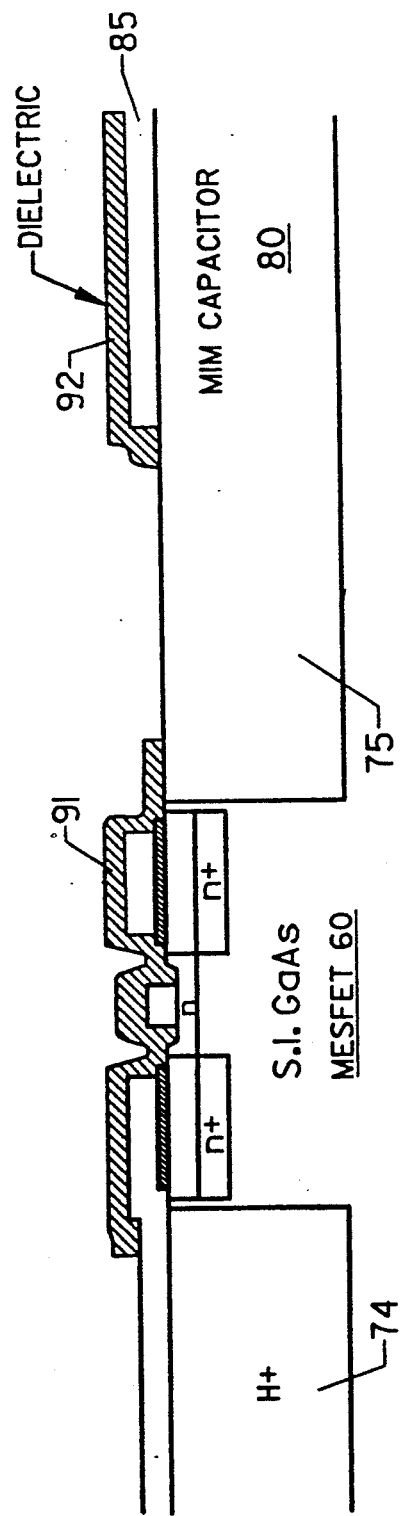

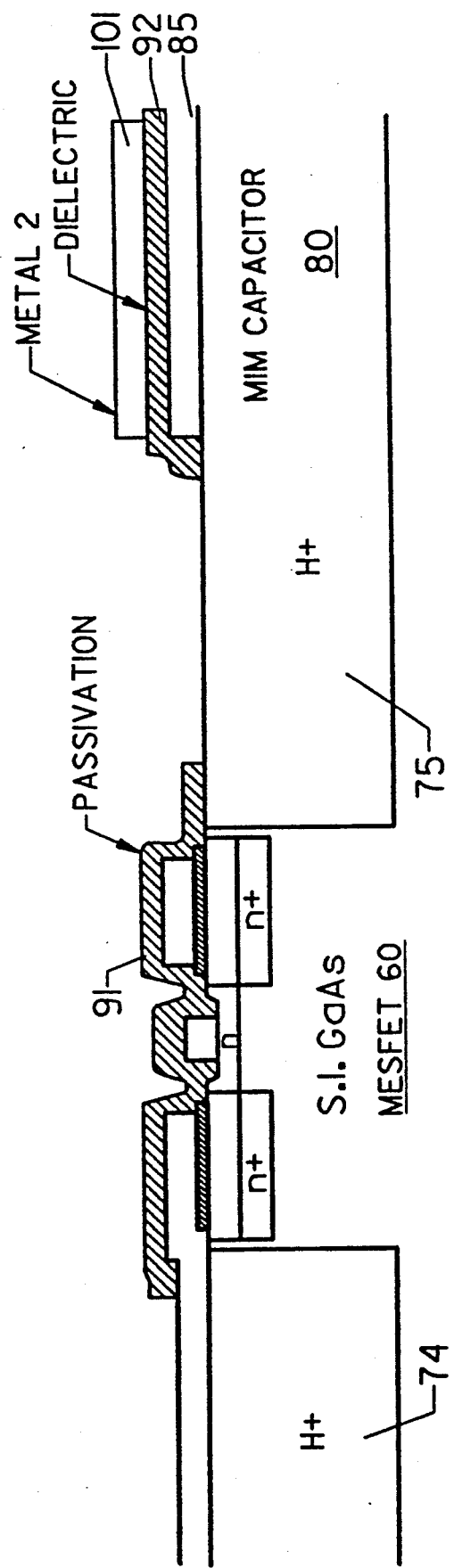

THREE METAL PERSONALIZATION OF APPLICATION SPECIFIC MONOLITHIC MICROWAVE INTEGRATED CIRCUIT

This is a divisional application of application Ser. No. 258,607, filed Oct. 17, 1988, now U.S. Pat. No. 4,959,705.

FIELD OF THE INVENTION

The present invention relates in general to integrated circuit devices and is particularly directed to a methodology and structure through which the components of a monolithic microwave integrated circuit are selectively interconnected to obtain an application-specific signal processing function.

BACKGROUND OF THE INVENTION

Continuing refinements in semiconductor materials development an circuit design have made it possible to apply integrated circuit technology to a broader (higher frequency) range of signal processing problems, and thereby significantly reduce the size and cost of system components. One of the more recent approaches proposed for producing high frequency application, GaAs-resident systems and devices involves a fabrication technique that is application specific, similar to that used for implementing silicon wafer processing, wherein a variety of circuit building blocks (e.g. transistors, resistors, diodes) are formed in a semiconductor wafer and selectively interconnected and matched to realize an overall signal processing functionality (e.g. mixer, amplifier, switch, oscillator, limiter, isolator, attenuator), as well as an overall specification (i.e. operating frequency and power range.)

More particularly, within a (GaAs) wafer, a plurality of elemental circuit components, such as diodes, field effect transistors, capacitors and resistors are strategically located to form a set of "footprints", the selective interconnection of which, by means of an overlying metallization pattern (which may also include additional passive components, such as inductors, transformers and capacitors), yields a 'personalized' architecture that is dedicated to a specific signal processing application. Conventionally, the metallization pattern has been formed of two layers of metal, the shapes and locations of which relative to one another define the characteristics of reactance elements, such as inductors and capacitors, through which the wafer-resident "footprints" are personalized.

For this purpose, the first metal layer is normally selectively formed either directly on a conductive layer, such as an FET gate/ohmic contact layer, or on a wafer passivation layer and is itself passivated by an MIM dielectric layer. The second metallization layer is then formed as an air-bridge between selected portions of the first metallization layer. Where tuning elements, such as MIM capacitors, are incorporated into the metallization interconnect structure, the circuit properties of each element are dependent upon the geometry of each metallization layer, so that multiple masks must be prepared in order to 'personalize' the footprint. In addition, fabrication complexity (which impacts circuit yield and cost) is increased because of the use of a complicated dielectric laminate structure and the consequential need for a dummy layer to achieve proper step coverage and prevent unwanted etch back (of the first metallization layer). As a result, what is supposed to be a circuit fabrication aid (the availability of a precursor footprint), in reality, only partially facilitates the implementation of a particular circuit design.

SUMMARY OF THE INVENTION

In accordance with the present invention, the circuit fabrication strategy goal, in application specific monolithic microwave integrated circuit designs, of effectively providing a set of footprints that can be readily interconnect-tailored, or personalized, without considerable additional processing complexity (as in the above-referenced two-metal scheme) is achieved by including, as part of the footprint, a substantial portion of the metallization through which the circuit components within the wafer are to be interconnected. The metallization itself is preferably comprised of three layers, the geometry and location of an intermediate one of which are defined to facilitate the selection and tuning of (LC) reactance circuit components, so as to 'personalize' the signal processing properties of the integrated circuit.

Pursuant to a preferred embodiment of the inventive processing scheme, on a first surface of (GaAs) semiconductor structure containing a plurality of semiconductor regions and conductive material for ohmic contact to the regions, a first metal layer is formed, such that portions of the first metal layer are in ohmic contact with the conductive material. The first metal layer provides the bottom or first plate of one or more MIM capacitors that are incorporated in the multi-layer metal interconnect pattern as part of the footprint signature of the GaAs structure. A first dielectric layer, which serves as the dielectric insulator of the MIM capacitors, is then formed on second portions of the first metal layer. A second, or intermediate, metal layer is selectively formed on the second portions of the first metal layer, so as to provide second or top plate segments of MIM capacitors, that are available to be selectively included within the integrated circuit that is eventually formed as a result of 'personalization' of the footprint. It is the topology of the circuit device regions within the semiconductor substrate and that of the layers of first and second metal and dielectric thereon that provides a footprint of multiple circuit function capability.

'Personalization'/tuning of the footprint is accomplished by the selective formation of a third metal air bridge layer to interconnect portions of the first and second metal layers of the footprint and thereby interconnect semiconductor device regions of the semiconductor structure with capacitive reactance elements within the first and second metal interconnect structure of the footprint. The selective formation of the third metal layer may include the formation of one or more inductor elements (e.g. spiral inductors) as part of the air-bridge, so as to form, with the MIM capacitor elements, lumped impedance elements for controllably tuning the signal processing characteristics of the integrated circuit. This third metal layer may also be used in conjunction with the first two metal layers to form low loss microwave transmission lines for circuit matching and optimization. Advantageously, because circuit participation of the interconnect reactance elements of the footprint is not established until formation of the air bridge of the third metal layer, only a single mask is required to 'personalize' the footprint to a specific type of signal processing device the electrical characteristics of which are tuned to a specific range of operation.

BRIEF DESCRIPTION OF THE DRAWINGS

FIGS. 2-11 are cross-sectional diagrammatic illustrations of a portion of an integrated circuit device fabricated using a three-metal personalization process in accordance with the present invention;

DETAILED DESCRIPTION

Figure 1:
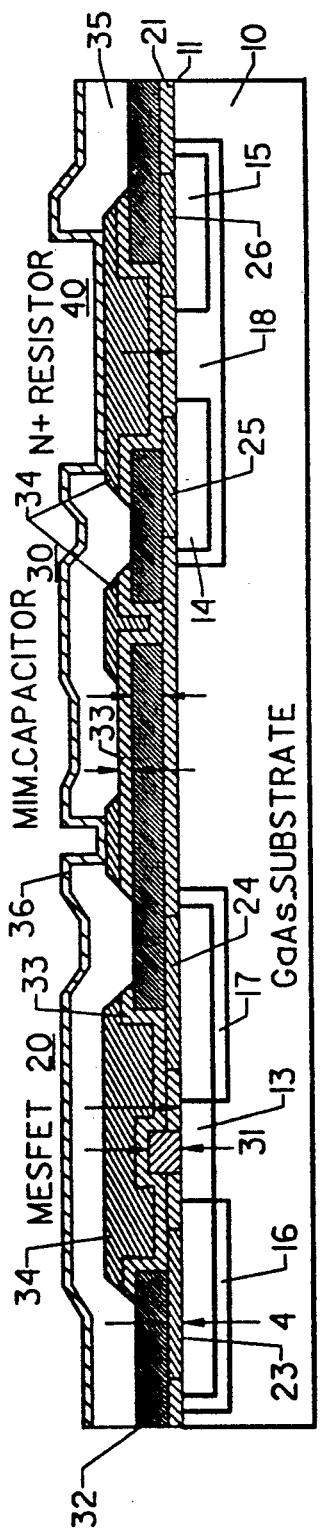
FIG. 1 is a cross-sectional diagrammatic illustration of a portion of an integrated circuit device fabricated using a conventional two-metal personalization process.

Before describing the processing methodology and personalized integrated circuit architecture resulting from such processing methodology in accordance with the present invention, the architecture of a conventional two-metal GaAs integrated circuit architecture for providing multi-circuit function capability, including the incorporation of MIM capacitor structure within the interconnect metal, will be reviewed with reference to FIG. 1, which is a cross-sectional diagrammatic illustration of a portion of an integrated circuit device fabricated using a two-metal process.

Specifically, FIG. 1 shows a field effect transistor (MESFET) 20, an MIM capacitor 30 and an N+ resistor 40 resident in a (P conductivity type) GaAs substrate 10. Within the GaAs substrate 10 proper, opposite conductivity type (N type) regions are introduced (e.g. ion-implanted) to form the source and drain regions of the MESFET 20 and the resistor region of N+ resistor 40. For this purpose, a first dielectric layer (e.g. silicon nitride) is selectively formed on the top surface 11 of the substrate 10 to expose areas into which N— regions 13, 14 and 15 are formed, region 13 corresponding to the channel regions of MESFET transistor 20 while regions 15 and 16 corresponds to surface contact regions of resistor 40. Thereafter, via a second mask and N+ implant, N+ source and drain regions 16 and 17 of MESFET 20 and N+ region 18 of resistor 40 are formed.

A second dielectric layer (e.g. silicon nitride) is then selectively formed over the surface of the implanted substrate to expose areas overlying N+ regions 16, 17 and 18 whereon ohmic contact layers 23, 24, 25 and 26 are formed by subsequent metal deposition through the second silicon nitride layer. Following the deposition of ohmic contact metal layers 23, 24, 25 and 26, a third silicon nitride layer is formed atop the structure and an windows opened therein extending to the surface 11 of the substrate 10 between source and drain regions 16 and 17 of MESFET 20. Following the selective etch through the third silicon nitride layer, gate metal 31 is deposited.

Next, using a fifth mask, a first metal layer 32 of the two-metal interconnect structure is selectively formed, so as to overlie the three silicon nitride layer structure and to be in ohmic contact with ohmic contact layers 23, 24, 25 and 26, as shown. In the region of MIM capacitor 30, metal layer 32 is formed to provide the bottom or first plate of the capacitor.

Next, a fourth (silicon nitride) dielectric layer 33 is deposited to a prescribed thickness to establish the dielectric breakdown of the capacitor 30 and the capacitance value thereof. Atop the four silicon nitride dielectric layer, a polyimide layer 34 is selectively formed by use of a sixth mask. Next, contact vias through silicon nitride layer 33 to the first metal layer 32 for a second metal layer are defined by a seventh mask through which silicon nitride layer 33 is etched. The opening in the polyimide layer 34 provided by the sixth mask defines the surface area Ac for conductive contact between a second metal layer 35 and the dielectric layer 33 of MIM capacitor 30.

The second metal layer 35 is then selectively plated on the structure through the openings in the polyimide layer 34, so as to contact the first metal layer 32 and be contiguous with the top surface of the polyimide layer 34 and the exposed surface of the silicon nitride layer 33 in the region Ac of MIM capacitor 30. In the circuit configuration shown in FIG. 1, second metal layer 35 is formed so as to connect MIM capacitor 30 in series between the drain contact 23 of MESFET 20 and one end (contact 25) of resistor 40. Following selective formation of the second metal 35, the entire structure is coated with a fifth silicon nitride (passivating) layer 36.

As pointed out previously, and as will be appreciated from the above explanation and a study of FIG. 1, a fabrication process for realizing a desired circuit functionality, through the selective interconnection of prescribed circuit regions within the substrate 10 by means of the two-layer interconnect structure containing the first metal layer 32 and the second metal layer 35, requires a complex sequence of masking and nitride formation steps. Namely, even though the GaAs substrate itself may contain an array of different types of active and passive semiconductor regions, such as the field effect transistor regions of MESFET 20 and the opposite conductivity regions of resistor 40, spaced apart therefrom, realization of a final circuit architecture still requires considerable additional processing complexity. As a consequence, one of the principal objectives of utilizing a footprint or a library of footprints of circuit device architectures that may be selectively 'personalized' to realize a specific type of signal processing architecture becomes only a preliminary portion of an overall complex manufacturing process.

More particularly, although it would appear that the objective of providing a library of footprints which can be subsequently personalized by interconnect metallization to achieve a sought after circuit design may be accomplished using a two-metal 'personalization' process, what is encountered, in effect, is the need for a considerable number of additional fabrication steps (including mask design and preparation). This is in direct contrast to the intent of the footprint approach in which, once the footprint design effort has been completed and a library of versatile multi-component architectures is available, the selective interconnection of the components of those architectures and the tuning of the resulting signal processing device (by means of the overlying interconnect architecture) has been demonstrated to be realizable through a relative simply, low cost and quick turn around exercise. With the two-metal process, however, it cannot be guaranteed that most of the production cost will have been incurred once a footprint design has been completed. Instead, there are still considerable design and processing steps yet to be performed.

In accordance with the present invention, however, the true intent of application specific monolithic microwave integrated circuit processing is achievable by incorporating a substantial portion of the interconnect metal (including reactive components) into the footprint, so that the user of the process truly enjoys the sought after savings in cost and turn around time in the production of a specific signal processing architecture.

EXAMPLE

Referring now to FIGS. 2-11, a three-metal processing methodology through which a significant portion of the 'personalization' interconnect is incorporated into the footprint to reduce the final processing complexity will be described. In the description to follow, a device architecture similar to that of FIG. 1, specifically the coupling of an MIM capacitor to a MESFET will be described. It should be observed, however, the example given is simply for purposes of illustration and is not limitative of the application of the invention to a particular type of device or circuit configuration.

Figure 2:
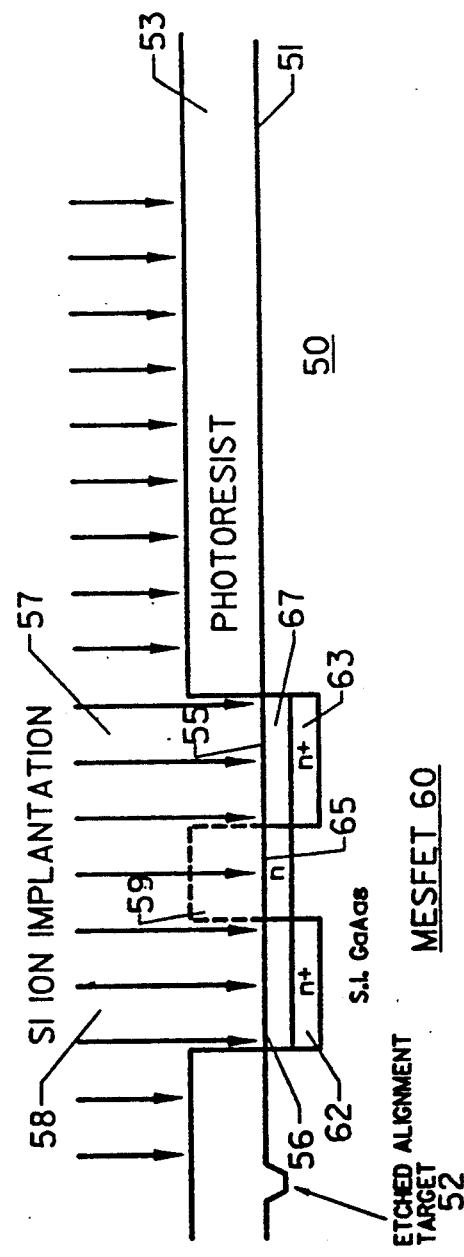

FIG. 2 diagrammatically shows a semi-insulating GaAs substrate 50 having a top surface 51 in which an etched alignment target 52, for subsequent mask alignment is provided, has been patterned. Atop surface 51 a first layer of photoresist 53, such as AZ 1370, is selectively formed, so as to expose surface portions 55 and 56 through windows 57 and 58, respectively, where source and drain regions of a MESFET 60 are to be provided. The thickness of photoresist layer 53 may be on the order of 2000 to 6000 Angstroms and is sufficient to prevent the penetration of an N+ implant species into the surface of substrate 50, other than where the windows 57 and 58 expose surface portions 55 and 56.

An ion implant of silicon or selenium into exposed surface portions is then carried out to form N+ regions 62 and 63 of MESFET 60. This initial selective mask and implant step is also employed to provide N+ regions 60 at other portions of the GaAs wafer (not shown), such as N+ resistor regions similar to FIG. 1. In accordance with customary practice in the manufacture of GaAs circuit devices, the spacing between the N+ regions will depend upon the type of device employed and the operational characteristics of the device. For an individual MESFET, for example, the spacing between source and drain will be considerably less than that of the segments of an N+ serpentine resistor or for different MESFETs operating at different potentials. As the operational voltage is changed, the spacing also changes.

Following the ion implantation of N+ regions 62 and 63 of MESFET 60, portion 59 of photoresist layer 53 (shown in broken line form), is removed (stripped off), so as to expose surface portion 65 (as well as surface portions 56 and 57), and a second (N) ion implant is carried out, to form N surface (channel) region 67, which overlaps N+ regions 62 and 63, as shown. Following each of the N+ and N implant steps, the implanted dopants are activated (e.g. by capless annealing in an arsine overpressure at high temperature (on the order of 800°–850° C.) to complete the formation of the active surface regions of MESFET 60.

In addition to the selective implant of N+ regions into the surface of substrate 50 to form shallow resistor regions, similar to that shown in the conventional structure of FIG. 1, thin film metallic resistors may be deposited over selected regions of the substrate. In this instance, the deposition of a thin film resistor material, such as nickel chromium, may be formed at those regions where thin film resistors are desired. It should be noted, however, that this is an optional mechanism for providing passive resistor components within the architecture and is not mandatory in the inventive three-metal process.

Figure 3:
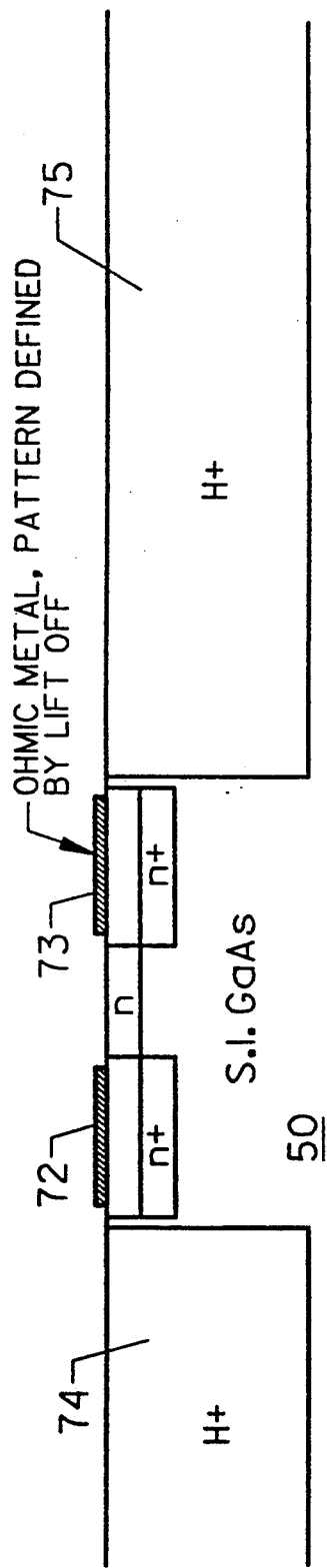

Upon completion of the N and N+ ion implant step (including implant activation anneal), ohmic contact metal (such as a multimetal layer of AuGe/Ni/Au ) is selectively deposited on the surface of each of regions 62 and 63, as shown in FIG. 3, by conventional positive photoresist lift-off processing. Ohmic contact metal layers 72 and 73 typically have a thickness on the order of 2000–2500 Angstroms and are to be overlaid by contiguous with either the first or second metal layers of the interconnect structure. (The ohmic contact layer is not interconnect metal).

Following patterning of the ohmic contact metal layers 72 and 73, inter-device isolation is carried out, preferably by deep H+ ion implantation, so as to form isolation regions 74 and 75. For this purpose, a thick photoresist mask is selectively formed atop the active regions of the various circuit devices (such as MESFE 60) to protect the active regions from the penetrating H+ implant. Alternatively, mesa etch isolation may be employed. In this circumstance, the protective mask shields the active regions from the substrate removing action of the etch. For purposes of the present embodiment, isolation is achieved by an H+ ion implant (e.g. 5.0 E14 at 275 keV) at regions 74 and 75.

Figure 4:
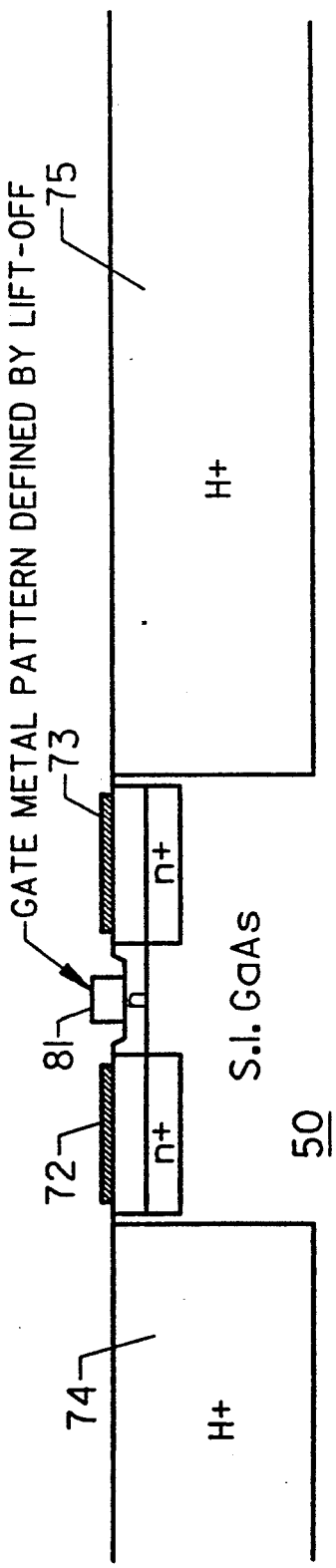

Next, as illustrated in FIG. 4, the gate of MESFET 60 is formed by conventional metal deposition and positive photoresist lift-off processing. Prior to deposition of gate metal, channel region 65 is preferably wet-etched (using ammonium hydroxide-based solution) to controllably remove a prescribed surface portion (e.g. 500–1000 Angstroms) of the gate region to achieve the desired drain to source current and Vpo. During the gate formation step, a metallization alloy such as Ti/PT/au/Ti is employed for gate metal 81. Similar photoresist lift-off processing of other gates, gate feeds and gate feed tabs is employed across the surface of the substrate to complete all gate metal patterning.

After the patterning of the gate metal 81 (FIG. 4), the first metal layer of the three-metal interconnect structure is formed. This first metal layer serves the function of interconnect, transmission line metal, the bottom electrodes of MIM capacitors and contact pads for throughwafer-vias. Using conventional positive photoresist lift-off patterning of deposited metal, a metallization layer of Ti/Pt/Au/Ti alloy is selectively formed as first metallization portions or regions 82, 83, 84 and 85, as shown in FIG. 5. Portion 82 is contiguous with ohmic contact layer 72 of source region 62 of MESFET 60 and extends over H+ isolation region 74 as a transmission link. Portion 83 is contiguous with the top surface of drain ohmic contact layer 73. Portion 84 serves as interconnect metal for device regions other than those shown, while portion 85 serves as the bottom electrode of an MIM capacitor to be formed.

In addition to bottom plate, transmission line and contact structures shown for the exemplary embodiment, the first metal layer may also be selectively patterned to provide an inductive component, such as a spiral inductor, over the top surface of the substrate. Subsequent third metal contact to selected portions of the inductor will define the magnitude of the inductance between the interconnected end points. However, as will be described below, in accordance with a preferred embodiment of the invention, inductive components are formed as part of the third metal layer of the interconnect structure for tuning the performance parameters of the completed circuit architecture, since it is the third metal layer through which the personalization is carried out, the first and second metal layers being actually part of the footprint. Still, it should be noted that, as the first metal layer can be used to provide the bottom plate of selectively tailorable capacitors, that same first metal layer may also be selectively configured to establish inductor components, contact to which is subsequently defined during the personalization process (selective formation of the third metal layer).

Following the formation of the first metal layer, a (capacitor dielectric) insulator layer is nonselectively deposited over the entire surface of the structure show in FIG. 5, preferably by plasma-enhanced chemical vapor deposition. Thereafter, using a conventional photoresist mask and etch sequence (e.g. reactive ion etch), the dielectric layer is patterned to obtain a protective dielectric layer 91 overlying MESFET 60 and a capacitor dielectric layer 92 atop the first metal layer 85 of the MIM capacitor 80, as shown in FIG. 6. Materials suitable for the first dielectric layer include silicon nitride, silicon oxide and silicon oxynitride. Selective formation of the passivation and capacitor dielectric layer portions 91 and 92 is followed by the formation of a second layer of interconnect metal M2, as shown in FIG. 7.

As mentioned briefly above, in a conventional footprint personalization process, the footprint is defined only by the disposition of regions within the semiconductor wafer, and tailoring or personalizing of final circuit functionality and its intended signal processing parameters are effected by each of the steps of the interconnect metal formation process. Pursuant to the present invention, on the other hand, the topology of an individual footprint is not limited to merely wafer layout, but also includes the first and second metal layers of the interconnect structure, which are arranged to include components such as adjustable MIM capacitors strategically distributed throughout the interconnect structure where tuning/filter components may be required to set the performance parameters of underlying active device regions. Personalization is carried out by the selective formation of a third air bridge metal layer between port-ions of the first and second metal layers of the footprint. As a consequence, both processing complexity and the time required (including any mask preparation) to complete the topology definition of the final circuit configuration are considerably reduced.

For this purpose, a metal similar to that used for that of the first metal layer (e.g. Ti/PT/AU alloy) is deposited and selectively removed by conventional positive photoresist lift-off processing at selected areas where MIM capacitors are to be formed. For MIM capacitor 80, second metal layer 101 is shown as being formed atop dielectric layer 92. To permit selective tailoring, during the formation of the third metal layer, of the the MIM capacitors, in those regions where such capacitors are to be provided, second metal layer 101 is preferably configured as a plurality of spaced apart segments, as shown at 101-1, 101-2, 101-3 in FIG. 7A. Second metal layer 101 forms the top electrode(s) of the MIM capacitors, intermediate interconnects and air bridge contact pads. By configuring the second metal layer as an arrangement of electrode segments, the magnitude of the capacitance desired for a specific circuit application can be selectively defined simply by connecting the air bridge metal (the third metal) to those ones of the second metal segments that will yield the sum total of the prescribed capacitance.

Figure 8:
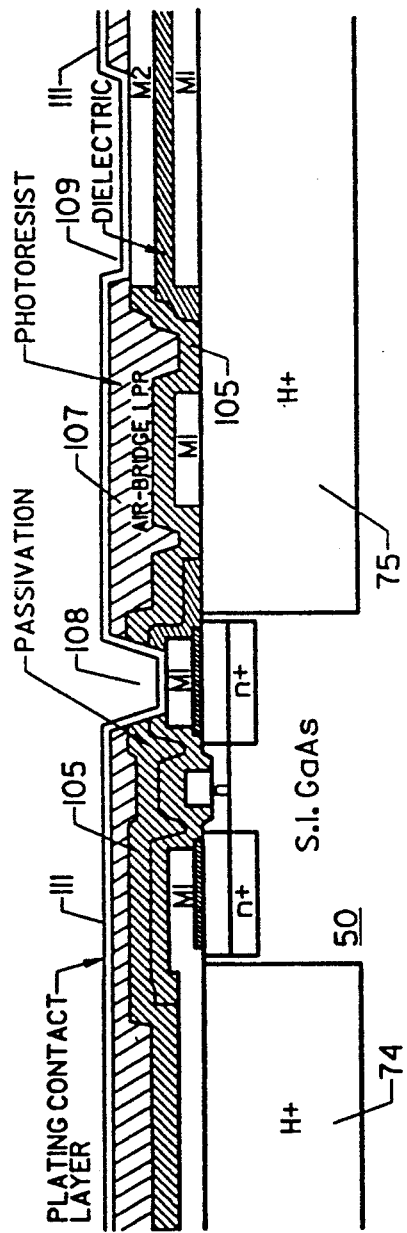

Following the selective formation of the second metal layer 101 shown in FIG. 7, a dielectric passivation layer (e.g. silicon nitride) is nonselectively deposited atop the surface of the entire structure and then selectively patterned (e.g. by reactive ion etching), so as to selectively expose those portions of the underlying metal to which an air bridge-forming third metal is to be connected, as shown at 105 in FIG. 8.

Then, an air bridge-underlying layer of photoresist 107 is selectively patterned atop photoresist layer 105 to expose regions in the passivation layer 105 to be etched. Dielectric layer 105 is then etched to expose capacitor top plate electrode 101 (the second metal layer M2) and the top surface of portion 83 of the first metal layer M1. A thin (50/500 Å) Ti/Au layer is then deposited by planetary evaporation to provide a conductive layer for subsequent (pulse) plating. As shown in FIG. 8, plating contact layer 111 nonselectively extends over the entire structure, including a first window 108 through photoresist layer 107, passivation layer 105 and dielectric layer 91 to portion 83 of the first metal layer M1, and through an opening 109 in photoresist layer 107 to expose the top surface of second metal layer M2.

Figure 9:
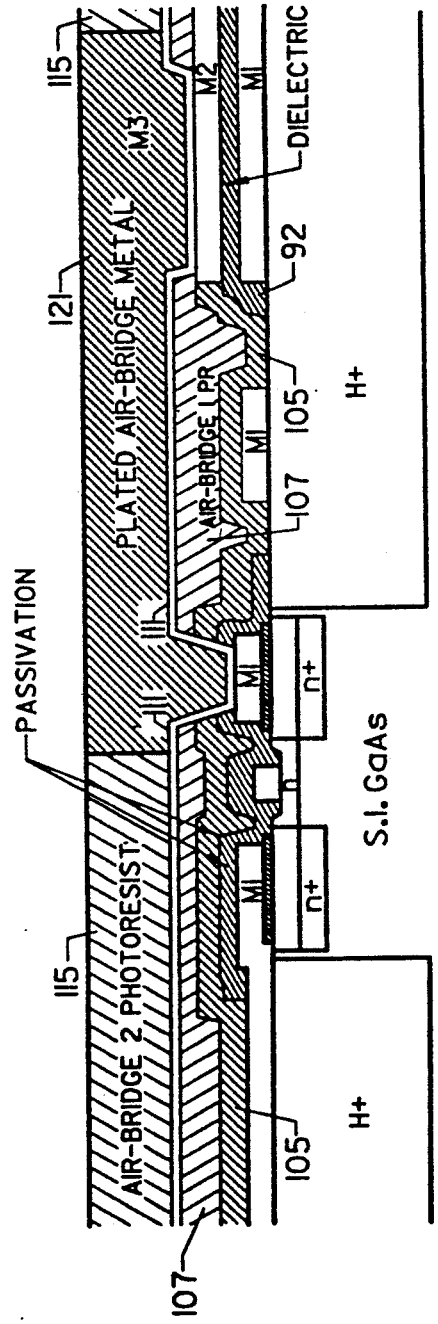
Figure 10:
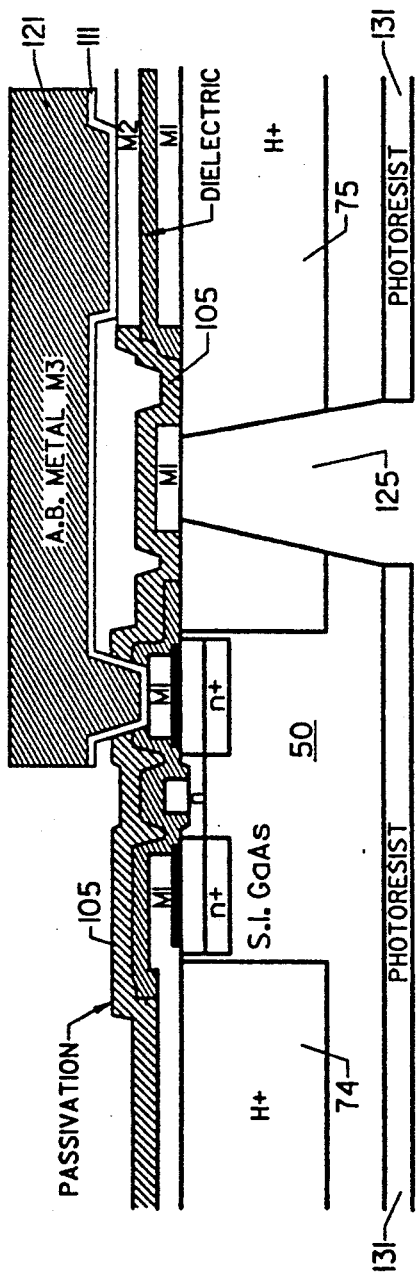

Next, as shown in FIG. 9, an air bridge photoresist layer 115 is selectively deposited and air bridge metal (the third metal layer M3), which bridges drain metal (M1) portion 83 and the top plate 101 (metal M2) of capacitor 80, is plated to a thickness on the order of 2.5 microns. After a wash removal of photoresist layer 115, the exposed portion of plating contact layer 111 atop photoresist layer 107 is etched. Thereafter, photoresist layer 107 is etch-stripped, leaving the third metal (M3) layer 121 as an air bridge freely standing and contiguous with portion 83 of the first metal layer (Ml) and portion 101 of the second metal layer (M2), as shown in FIG. 10.

Figure 10A:
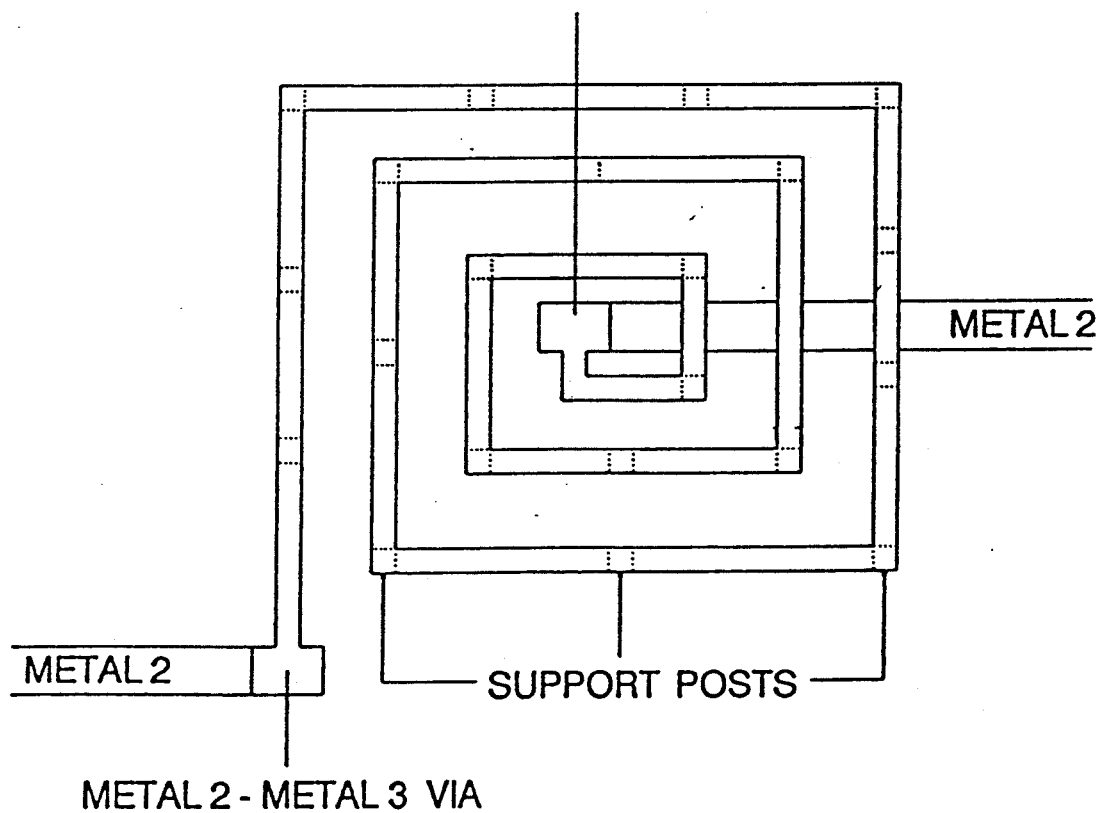
FIG. 10A is a diagrammatic plan view of a portion of the topology of the third, air bridge metal layer in which a spiral inductor is formed.

As pointed out previously, in accordance with the present invention tailoring or personalization of the footprint structure of FIG. 7 is accomplished by the selective formation of the third (air bridge) metal layer for interconnecting selected surface regions of the first and second metal layers and thereby incorporating bypass and filter capacitor elements as needed to define the signal processing functionality and operational parameters of an intended circuit design. Where additional tuning reactance is required (e.g. a complementary inductive reactance component for achieving requisite signal matching of a capacitive element), the parameters of such a component may be readily defined by means of the air bridge metal layer. Namely, the inductance required may be formed exclusively within the (selectively patterned) third metal layer through which underlying capacitance top plate metal (M2) is connected to another circuit region, such as through metal layer M1, as diagrammatically illustrated in the plan view of FIG. 10A. Where the circuit design strategy makes provision for the incorporation of tuning inductors as part of the interconnect metal, preselected surface portions of the substrate adjacent to device regions may be set aside or predesignated, so as to provide sufficient surface area for accomodating support posts (which extend between the spiral portion of the air bridge metal and the underlying substrate) as part of the air bridge layer. Because the inductance is formed after other circuit components are in place, the operational characteristics of the in situ footprint devices may be premeasured to precisely determine the amount of inductance required. As a consequence, when the air bridge metal is formed, the final operational characteristics of the resulting device can be predicted with extreme accuracy. It can be seen therefore that the three metal approach of the present invention not only greatly simplifies the personalization process, but enables the signal processing characteristics of particular circuit design to be very precisely defined.

Figure 11:
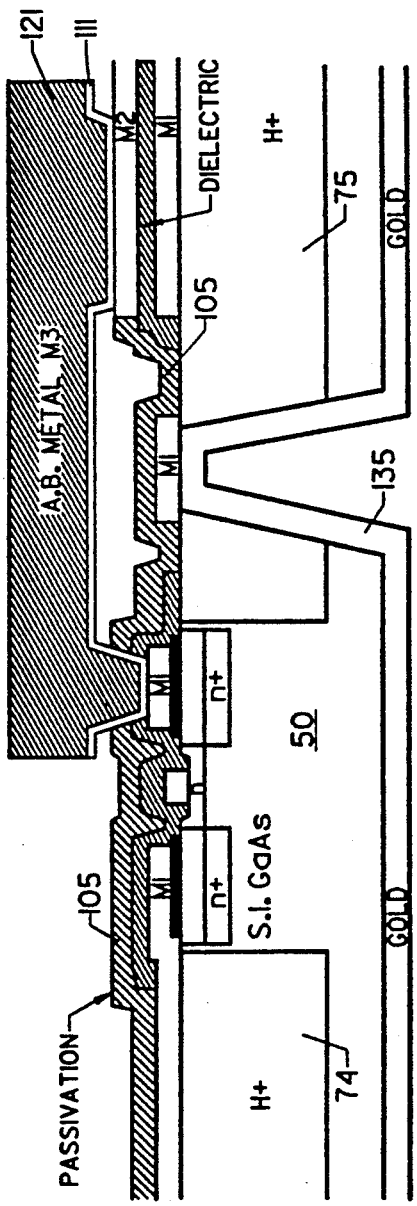
Figure 7A:
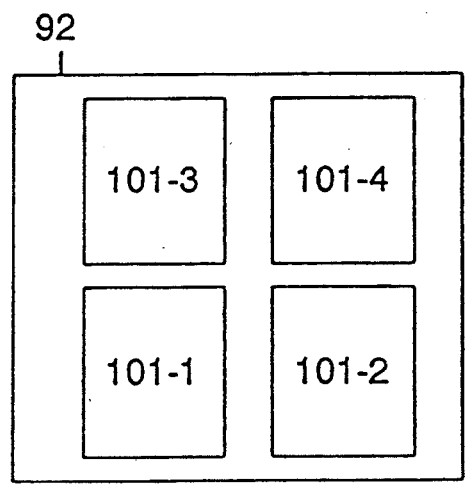
FIG. 7A is a diagrammatic plan view of a portion of the topology of the second metal layer in which segmented capacitor plates are formed.

Next, the wafer is lapped to a prescribed thickness (e.g. on the order of 100 microns) and etched-back Vias, as at opening 125 to portion 84 of the first metal layer, are provided. The underlying photoresist layer 131 through which the bottom of the substrate has been masked in the course of formation of the aperture 125 is then stripped and a bottom conductive (e.g. gold) plate layer 135 is nonselectively plated from the entire exposed surface of the backside of the substrate, as shown in FIG. 11.

As will be appreciated from the foregoing description, through the use of a three-metal interconnect formation process, the manufacture of application specific monolithic microwave integrated circuit designs is facilitated by the use of a set of footprints in which a portion of the interconnect structure is resident in the footprint itself, so that final interconnect-tailoring or personalization can be effected without considerable additional processing complexity (as in the above-referenced two-metal scheme). The overall interconnect structure is preferably comprised of three layers, the geometry and location of an intermediate one of which (the second metal layer which is included as part of the footprint) are defined to facilitate the selection and tuning of (LC) reactance circuit components, so that signal processing properties of the final integrated circuit design can be accurately established through the selective formation of only a single metal layer (the third air bridge metal). The selective formation of the third air bridge metal layer may include one or more inductor elements, so as to form, with the MIM capacitor elements of the first and second metal layers, impedance matching elements for controllably tuning the signal processing characteristics of the integrated circuit. Advantageously, because circuit participation of the interconnect reactance elements of the footprint is not established until formation of the air bridge of the third metal layer, only a single mask is required to 'personalize' the footprint to a specific type of signal processing device the electrical characteristics of which are tuned to a specific range of operation.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method of manufacturing a semiconductor device comprising the steps of:
    (a) providing a semiconductor structure having semiconductor device regions formed therein and conductive material through which electrical ohmic contact is provided to said regions;
    (b) selectively forming a first conductive layer on the semiconductor structure provided in step (a), such that first portions of said first conductive layer contact conductive material through which ohmic contact is provided to said regions;
    (c) forming a first dielectric layer on said first conductive layer such that at least one second portion of said first conductive layer has said first dielectric layer formed thereon;
    (d) selectively forming a second conductive layer on said at least on second portion of said first conductive layer; and
    (e) conductively joining a portion of said first conductive layer with a portion of said second conductive layer by way of a third conductive layer.

2. A method according to claim 1, wherein step (e) comprises forming an air bridge of said third conductive layer between portions of said first and second conductive layers.

3. A method according to claim 1, wherein step (d) comprises selectively forming said second conductive layer on said at least one second portion of said first conductive layer so as to provide a plurality of spaced apart segments of said second conductive layer thereon, which form with said first dielectric layer and said first conductive layer a plurality of reactance elements, and step (e) comprises conductively joining a portion of said first conductive layer with selected ones of said plurality of spaced apart segments of said second conductive layer.

4. A method according to claim 1, wherein step (d) comprises selectively forming said second conductive layer on said at least one second portion of said first conductive layer so as to provide a plurality of spaced apart segments of said second conductive layer thereon, which form with said first dielectric layer and said first conductive layer a plurality of capacitive elements, and step (e) comprises forming a conductive air bridge between said first conductive layer and selected ones of said plurality of spaced apart segments of said second conductive layer.

5. A method according to claim 4, wherein said semiconductor structure comprises a GaAs substrate having a plurality of active and passive circuit elements formed therein and each of said first, second and third conductive layers comprises a respective metallic layer.

6. A method of manufacturing an integrated circuit containing a plurality of circuit components, interconnections of which include reactance elements selectively configured to define signal processing properties of said integrated circuit comprising the steps of:
    (a) providing a semiconductor structure containing a plurality of semiconductor regions and conductive material through which ohmic contact to said regions is effected;
    (b) selectively forming a metal layer on the semiconductor structure provided in step (a), such that first portions of said first metal layer ar in ohmic contact with said conductive material;
    (c) forming a first dielectric layer on second portions of said first metal layer;
    (d) forming a second metal layer on said second portions of said first metal layer and thereby forming with said first metal layer and said first dielectric layer therebetween capacitive reactance elements; and
    (e) forming a third metal layer which interconnects portions of said first metal layer with portions of said second metal layer and thereby interconnects semiconductor device regions of said semiconductor structure with capacitive reactance elements, characteristics of which are established in accordance with physical parameters of the second metal layer interconnected by said third metal layer.

7. A method according to claim 6, wherein said semiconductor structure comprises a GaAs substrate having a plurality of active circuit device regions formed therein, the selective interconnection of which defines the signal processing functionality of said integrated circuit.

8. A method according to claim 6, wherein step (e) comprises forming at least one portion of said third metal layer in a configuration which forms an inductive reactance so as to provide, together with a capacitive reactance to which said third metal layer is interconnected an LC impedance circuit.

9. A method according to claim 6, wherein step (e) comprises forming said third metal layer as an air bridge which interconnects portions of said first metal layer with portions of said second metal layer.

10. A method according to claim 9, wherein step (e) comprises forming at least one portion of said third metal layer in a configuration which forms an inductive reactance so as to provide, together with a capacitive reactance to which said third metal layer is interconnected an LC impedance circuit.

11. A method of manufacturing an integrated circuit containing a plurality of circuit components, interconnections of which include reactance elements selectively configured to define signal processing properties of said integrated circuit comprising the steps of:
(a) providing a semiconductor substrate containing a plurality of semiconductor device regions disposed in respective surface portions thereof and having formed thereon conductive material through which ohmic contact to said regions is effected;
(b) selectively forming a first metal layer on the semiconductor substrate provided in step (a), such that first portions of said first metal layer are in ohmic contact with said conductive material and second portions of said first metal layer extend over surface portions of said substrate spaced apart from said conductive material;
(c) forming a first dielectric layer on selected ones of at least said second portions of said first metal layer;
(d) forming a second metal layer on said selected ones of said second portions of said first metal layer and thereby forming with said first metal layer and said first dielectric layer therebetween capacitive reactance elements; and
(e) forming a third metal layer which interconnects portions of said first metal layer with portions of said second metal layer and thereby conductively interconnects semiconductor device regions with capacitive reactance elements, characteristics of which are established in accordance with physical parameters of the second metal layer interconnected by said third metal layer.

12. A method according to claim 11, wherein step (e) comprises forming at least one portion of said third metal layer in a configuration which forms an inductive reactance so as to provide, together with a capacitive reactance to which said third metal layer is interconnected, an LC impedance circuit.

13. A method according to claim 11, wherein step (e) comprises forming said third metal layer as an air bridge which interconnects portions of said first metal layer with portions of said second metal layer.

14. A method according to claim 13, wherein step (e) comprises forming at least one portion of said third metal layer in a spiral configuration which forms an inductive reactance so as to provide, together with a capacitive reactance to which said third metal layer is interconnected, an LC impedance circuit.

15. A method according to claim 11, wherein step (d) comprises forming said second metal layer as a plurality of adjacent metal segments on at least one selected second portion of said first metal layer and thereby forming with said first metal layer and said first dielectric layer therebetween a plurality of capacitive reactance elements, and step (e) comprises forming said third metal layer to interconnect a portion of said first metal layer with selected ones of adjacent metal segments of said second metal layer and thereby conductively interconnect a semiconductor device region with a capacitive reactance element, characteristics of which are established in accordance with physical parameters and numbers of the selected ones of the adjacent metal segments of said second metal layer interconnected by said third metal layer.

16. A method according to claim 15, wherein step (e) comprises forming said third metal layer as an air bridge which interconnects a portion of said first metal layer with said selected ones of adjacent metal segments of said second metal layer.

17. A method according to claim 11, wherein step (e) comprises the steps of:
(e1) measuring circuit functionality properties of semiconductor device regions disposed in said substrate, and
(e2) forming said third metal layer to interconnect selected portions of s id first metal layer with selected portions of said second metal layer and thereby conductively interconnect semiconductor device regions with capacitive reactance elements, characteristics of which are established in accordance with physical parameters of the second metal layer interconnected by said third metal layer, in accordance with the circuit functionality properties measured in step (e1).

18. A method according to claim 11, wherein step (a) comprises providing a semiconductor substrate which contains, in addition to said plurality of semiconductor device regions and conductive material through which ohmic contact to said regions is effected, a surface area portion which is devoid of semiconductor device regions, and further including the step (f) of forming a fourth metal layer in the shape of an inductive element supported above said surface area portion so that said fourth metal layer interconnects a first selected portion of said first metal layer with one of a second selected portion of said first metal layer and a selected portion of said second metal layer.

* * * * *